United States Patent
Botker

(10) Patent No.: US 7,724,081 B2
(45) Date of Patent: May 25, 2010

(54) AMPLIFIER FRONT-END WITH LOW-NOISE LEVEL SHIFT

(75) Inventor: Thomas L. Botker, Andover, MA (US)

(73) Assignee: Analog Devices, Inc., Norwood, MA (US)

(*) Notice: Subject to any disclaimer, the term of this patent is extended or adjusted under 35 U.S.C. 154(b) by 106 days.

(21) Appl. No.: 12/221,392

(22) Filed: Aug. 1, 2008

(65) Prior Publication Data

US 2010/0026386 A1 Feb. 4, 2010

(51) Int. Cl.
*H03F 1/02* (2006.01)
*H03F 3/45* (2006.01)

(52) U.S. Cl. .......................................... 330/9; 330/253

(58) Field of Classification Search ................. 330/9; 327/124
See application file for complete search history.

(56) References Cited

U.S. PATENT DOCUMENTS 6,087,897 A * 7/2000 Wang ............................. 330/9

OTHER PUBLICATIONS

Analog Devices, "1.8V to 5 V Auto-Zero, IN-AMP With Shutdown", AD8553, Rev. 0, Oct. 2005, pp. 1-20.

Linear Technology, "Zero Drift, Precision Instrumentation Amplifier With Digitally Programmable Gain", LTC6915, pp. 1-16, 2004.

Linear Technology, "Precision, Rail-To-Rail, Zero-Drift, Resistor-Programmable Instrumentation Amplifier", LTC2053/LTC2053-Sync, pp. 1-16, 2001.

\* cited by examiner

*Primary Examiner*—Steven J Mottola
(74) *Attorney, Agent, or Firm*—Koppel, Patrick, Heybl & Dawson

(57) ABSTRACT

An amplifier front-end comprises an input node for receiving a common-mode voltage $V_{cm}$, a differential transistor pair having first and second inputs and outputs, a capacitor, a reference voltage $V_{ref}$, an error correction circuit, and a switching network. The switching network charges the capacitor to $V_{ref}$; couples the capacitor to the differential pair's first input and couples $V_{ref}$ to the pair's second input such that the voltage at both inputs is $\sim V_{ref}$; and couples the input node to the capacitor's other terminal such that the voltage at the first input is level-shifted to $\sim(V_{cm}+V_{ref})$. The error correction circuit—typically an auto-zero circuit—is coupled to the differential pair's outputs and arranged to reduce charge injection error and kT/C noise components that would otherwise be present in the outputs due to the level shift.

12 Claims, 5 Drawing Sheets

AMPLIFIER FRONT-END WITH LOW-NOISE LEVEL SHIFT

BACKGROUND OF THE INVENTION

1. Field of the Invention

This invention relates generally to amplifier front-end circuits, and, more particularly, to front-end circuits which enable the amplifier to accommodate a common-mode input voltage of zero.

2. Description of the Related Art

An amplifier 'front-end' circuit operates to receive and buffer an input signal, and provide a representation of the received signal to a following 'back-end' stage. Two front-end circuits may be used to accommodate a differential input signal. The front-end and back-end circuits together provide an instrumentation amplifier.

One type of amplifier is a current-mode instrumentation amplifier. In a typical current-mode instrumentation amplifier, first and second front-end circuits provide respective output currents, and a back-end output stage provides an output which varies with the difference between the output currents. A conventional front-end for this type of amplifier is shown in FIG. 1. A common mode input voltage $V_{cm}$ is applied to one input of a differential transistor pair 10 biased with a tail current source 12. The pair transistors conduct respective currents, which drive a folded cascode stage. 14 that produces a single-ended output 16. This output is coupled to a second gain stage which includes an output transistor 18 biased with a current source 20, typically a field-effect transistor (FET). Output transistor 18 provides an output signal current 22 to an output stage (not shown).

When arranged as shown in FIG. 1, the voltages at the inputs to the differential pair are forced to be equal, and the voltage at the junction 24 of output transistor 18 and current source 20 tracks that at the pair inputs. Thus, the voltage at junction 24 will be approximately equal to zero when $V_{cm}=0$. Ideally, the FET of current source 20 operates in its saturation region. However, a voltage of zero at junction 24 forces the FET to turn off, thereby eliminating the bias current provided to output transistor 18. Therefore, a front-end having a configuration of this sort cannot function accurately when $V_{cm}=0$.

SUMMARY OF THE INVENTION

An amplifier front-end is presented which overcomes the problems noted above, providing a level-shift that enables accurate operation when $V_{cm}=0$, with little to no degradation of output current accuracy.

The present front-end circuit comprises an input node for receiving a common-mode voltage $V_{cm}$, a differential transistor pair having first and second inputs and outputs, a capacitor, a voltage source which provides a reference voltage $V_{ref}$, a switching network, and an error correction circuit. The switching network is arranged to:

charge the capacitor to $V_{ref}$;

couple the charged capacitor to the differential pair's first input and couple $V_{ref}$ to the differential pair's second input such that the voltage at both first and second inputs is $\sim V_{ref}$; and couple the input node to the capacitor such that the voltage at the first input is level-shifted to $\sim(V_{cm}+V_{ref})$. When coupled to a folded cascode and a second gain stage as shown in FIG. 1, the level-shift provides a non-zero voltage at junction 24 when $V_{cm}=0$.

The error correction circuit—typically an auto-zero circuit—is coupled to the differential pair's outputs and arranged to reduce charge injection error and kT/C noise components that would otherwise be present in the outputs due to the input level shift. Two of the present front-end circuits are suitably employed as the front-end of a current-mode instrumentation amplifier.

These and other features, aspects, and advantages of the present invention will become better understood with reference to the following drawings, description, and claims.

DETAILED DESCRIPTION OF THE INVENTION

Figure 1:
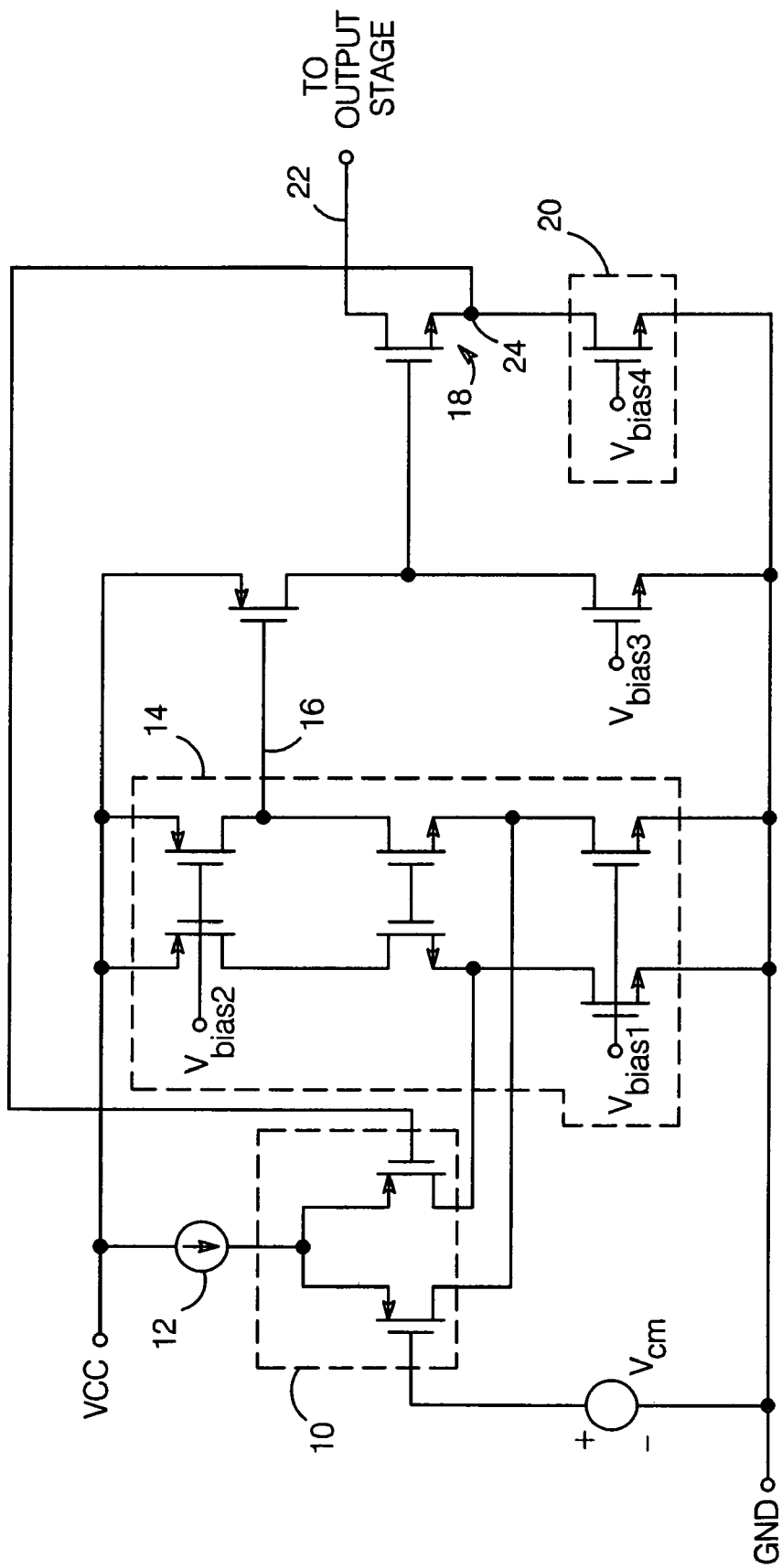
FIG. 1 is a schematic diagram of a known front-end circuit.

One solution to the problem of accommodating a common-mode voltage of zero ($V_{cm}=0$) with a front-end circuit such as that shown in FIG. 1 would be to level-shift the applied common-mode voltage, so that the voltage at junction 24 is greater than zero when $V_{cm}=0$. This could be accomplished with a capacitor that is first charged to a desired voltage, then connected in series with the applied input signal to effect the desired shift. However, switching the capacitor in series with the input signal in this way can introduce charge injection and kT/C noise that degrades the accuracy of output current 22.

Figure 2:
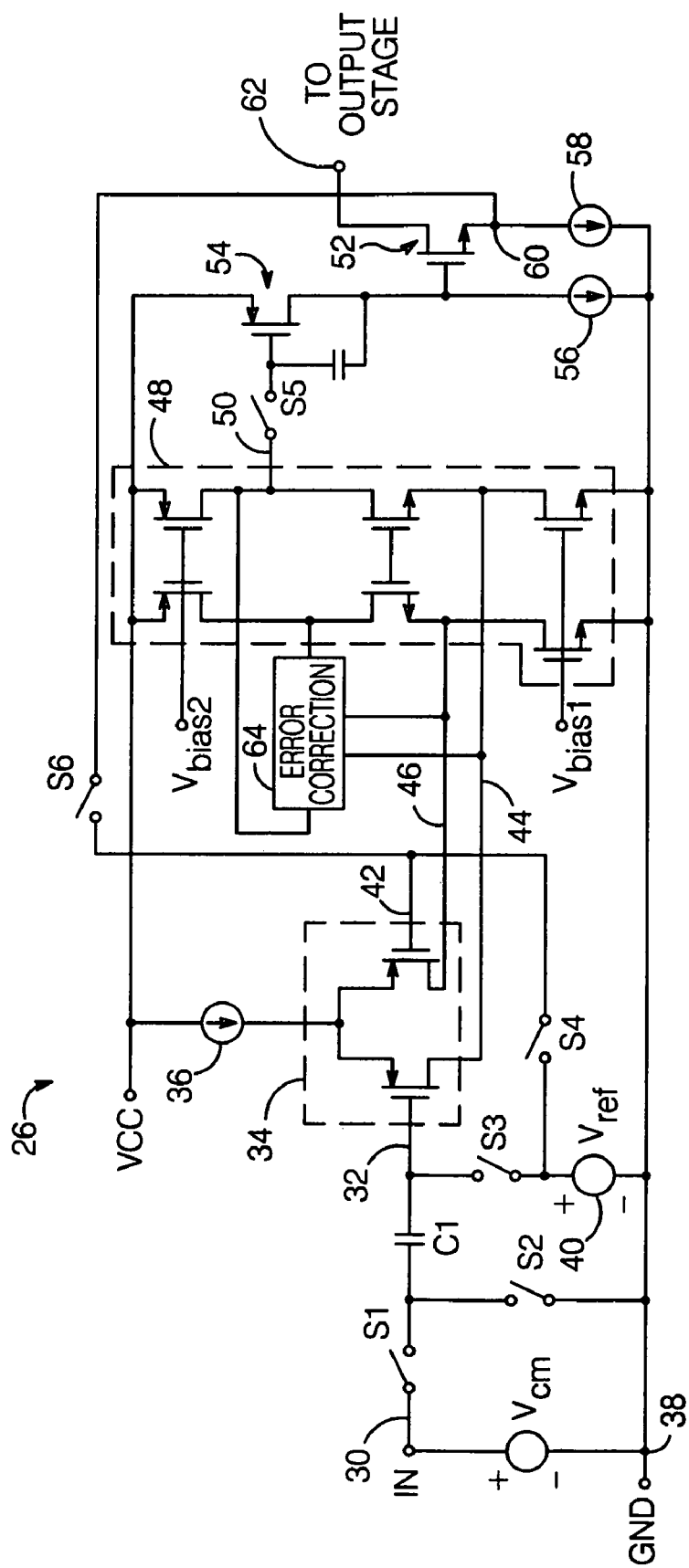
FIG. 2 is a block/schematic diagram illustrating the principles of a front-end circuit in accordance with the present invention.

The present invention avoids these problems, providing a level-shift that enables accurate operation when $V_{cm}=0$, with little to no degradation of output current accuracy. A diagram illustrating the principles of a front-end circuit 26 in accordance with the present invention is shown in FIG. 2. A common-mode input voltage $V_{cm}$ is applied at an input node 30. A capacitor C1 is coupled at a first terminal to the first input 32 of a differential transistor pair 34, which is biased with a current source 36. The second terminal of C1 can be coupled to input node 30 via a switch S1, or to a circuit common point 38 (which can include ground) via a switch S2. A voltage source 40 outputs a reference voltage $V_{ref}$, which can be coupled to C1's first terminal via a switch S3, and to the second input 42 of differential pair 34 via a switch S4.

The differential pair transistors conduct respective currents 44 and 46. These are provided to a load stage 48, typically a folded cascode stage (though other types of load stages might also be used), which produces a single-ended output 50. This is delivered to a second gain stage; in the exemplary embodiment shown in FIG. 2, the second gain stage includes an output transistor 52 which receives output 50 via a switch S5, and a transistor 54 biased with a current source 56; output transistor 52 is biased with a current source 58. The junction 60 of transistor 52 and current source 58 is fed back to second differential pair input 42 via a switch S6.

The signal current conducted by output transistor 52 is the front-end's output 62; this current would typically be delivered to a back-end circuit containing an output stage. The present front-end circuit also includes an error correction circuit 64 coupled to differential pair outputs 44 and 46, the operation of which is described below.

Switches S1-S6 form a switching network, the operation of which is controlled by a controller (not shown). In operation:

with S1 and S5-S6 open, S2, S3 and S4 are closed so that capacitor C1 is coupled between reference voltage $V_{ref}$ and GND such that C1 is charged to $V_{ref}$, and $V_{ref}$ is applied to the input 42 of differential pair 34 via S4;

S3 is opened, so that $V_{ref}$ is applied to the input 32 of differential pair 34 via C1, such that the voltage at both first and second inputs is $\sim V_{ref}$;

S2 and S4 are opened and S1 is closed, thereby coupling input node 30 to C1 such that the voltage at differential pair input 32 is level-shifted to $\sim(V_{cm}+V_{ref})$. Switches S5 and S6 are also closed, such that the voltage at junction 60 is fed back to input 42 of differential pair 34. During this period, the current at front-end output node 62 varies with $V_{cm}$ (assuming node 62 drives a resistive or capacitive load).

As noted above, using a capacitor and a switching network to effect a level-shift as described above can cause charge injection error and kT/C noise components, primarily due to C1 and the operation of S3 in this example, to be introduced into differential pair outputs 44 and 46 and thereby output signal 62. Error correction circuit 64 is coupled to outputs 44 and 46 and arranged to reduce charge injection and kT/C noise components that would otherwise be present in the outputs due to the level shift.

$V_{ref}$ should be selected so that with $V_{cm}=0$, the voltage at junction 60 is sufficient to enable current source 58 to operate properly. Current source 58 is typically implemented with an NMOS FET. In this case, $V_{ref}$ should be selected so that the FET operates in its saturation region with $V_{cm}=0$; a $V_{ref}$ of about 100 mv would typically suffice.

In addition to enabling current source 58 to operate when $V_{cm}=0$, the level-shift described herein may also serve to ensure the proper operation of current source 56. When current source 56 is implemented with a FET, the level-shift increases the voltage at the FET's drain, which increases the range of $V_{cm}$ voltages over which the FET operates in its saturation region.

Figure 3:
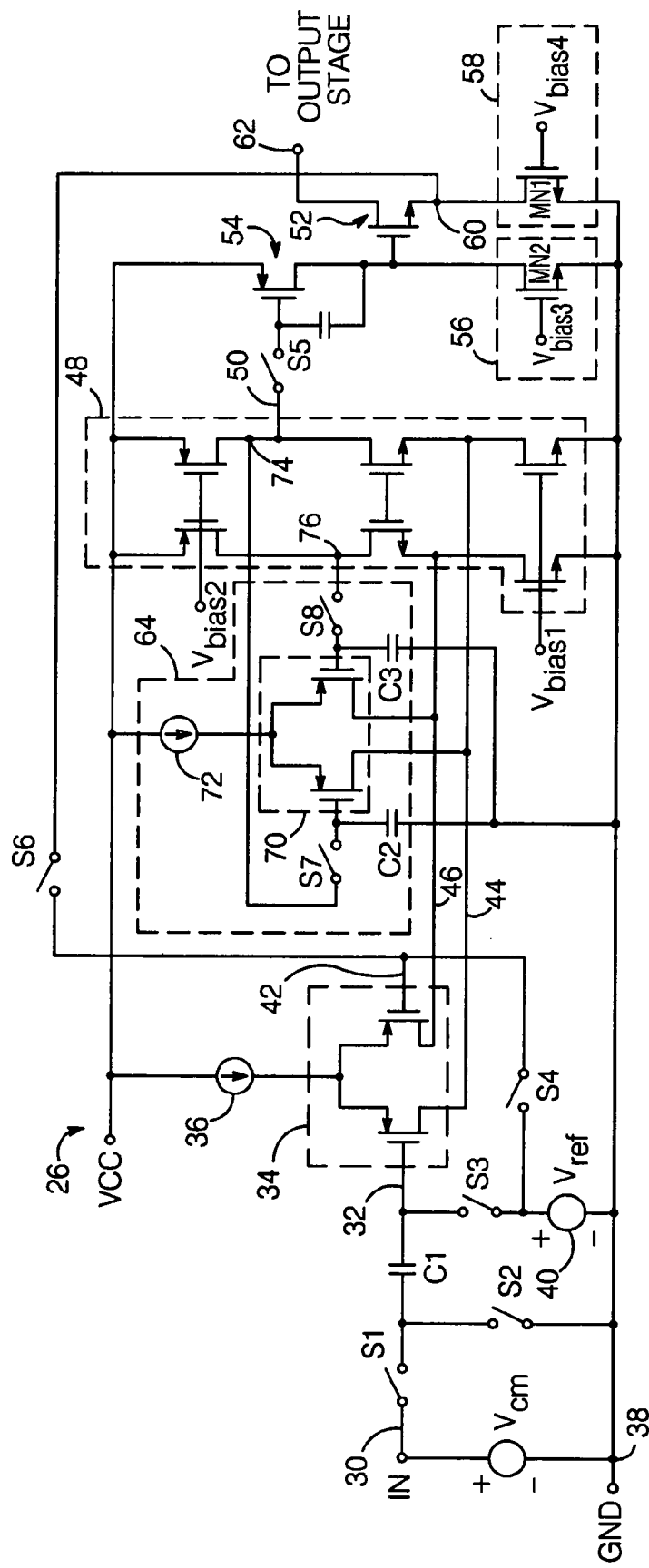
FIG. 3 is a schematic diagram of a preferred embodiment of a front-end circuit in accordance with the present invention.

A preferred implementation of a front-end circuit 26 in accordance with the present invention is shown in FIG. 3. Here, current sources 56 and 58 are shown as implemented with NMOS FETs biased with respective bias voltages, and error correction circuit 64 is implemented with an auto-zero circuit. The auto-zero circuit comprises a differential pair 70 biased with a tail current source 72, capacitors C2 and C3 connected between respective inputs of differential pair 70 and circuit common point 38, and switches S7 and S8 which are connected to nodes that vary with differential pair outputs 44 and 46. Here, switch S7 is connected between a node 74 within folded cascode stage 48 and one differential pair input, and switch S8 is connected between a node 76 within the folded cascode stage and the other differential pair input.

Figure 4:
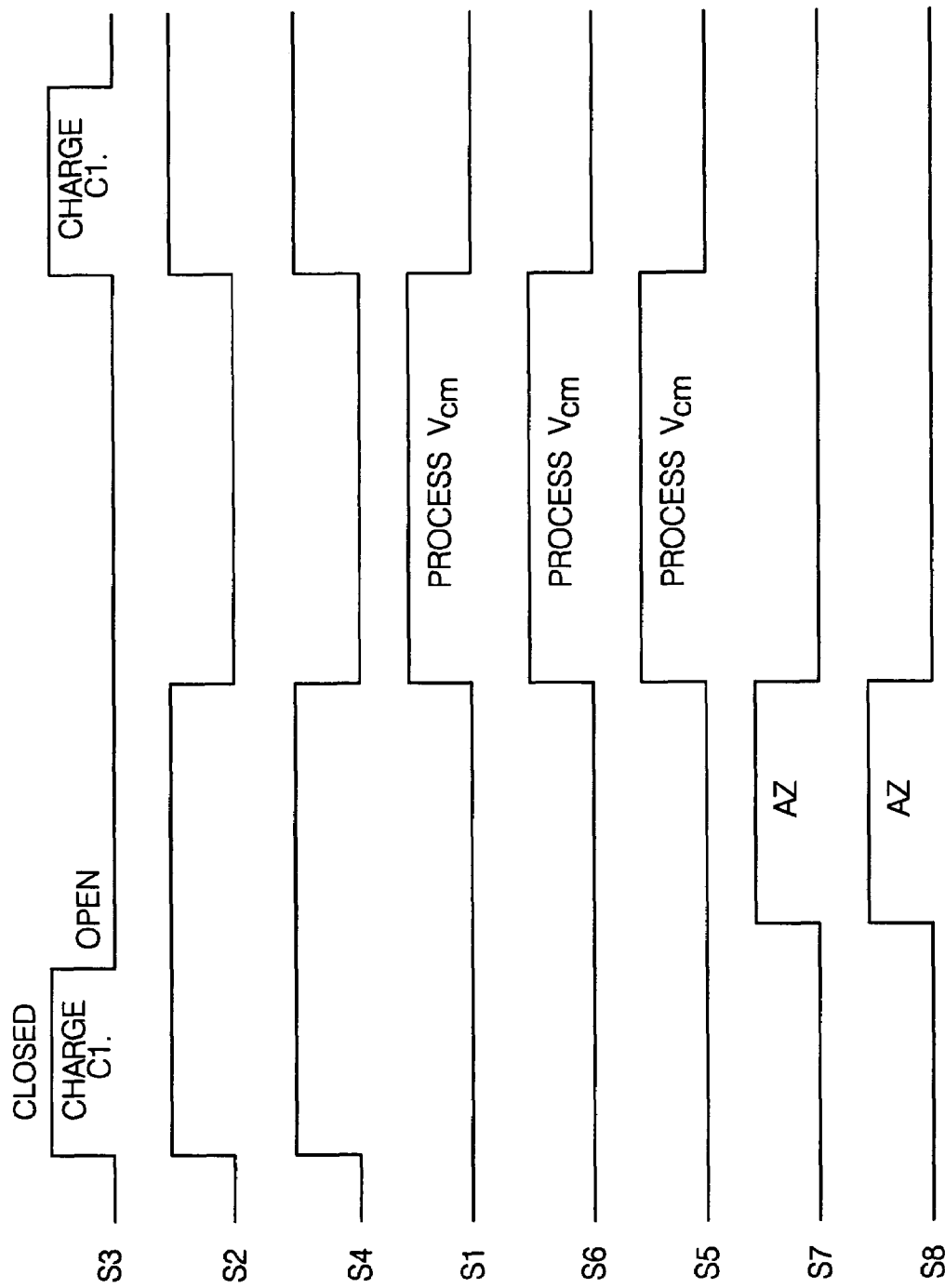
FIG. 4 is a timing diagram illustrating the operation of the front-end circuit of FIG. 3.

Operation of the front-end circuit of FIG. 3 is illustrated with the timing diagram shown in FIG. 4. Here, switches S1-S8 form a switching network which is controlled by a controller (not shown). In operation:

with S1 and S5-S8 open, S2, S3 and S4 are closed so that capacitor C1 is coupled between reference voltage $V_{ref}$ and GND such that C1 is charged to $V_{ref}$ and $V_{ref}$ is applied to input 42 of the differential pair via S4;

S3 is opened, so that $V_{ref}$ is applied to the input 32 of differential pair 34 via C1, such that the voltage at both first and second inputs is $\sim V_{ref}$;

S7 and S8 are closed, which begins the auto-zero process. With S7 and S8 closed, the voltages at nodes 74 and 76 are applied to the inputs of differential pair 70. The outputs of pair 70 are coupled to pair outputs 44 and 46 such that a negative feedback loop is formed, with differential pair 70 operating as a unity gain buffer. Differential pair 70 operates to provide currents to pair outputs 44 and 46 as needed to make the voltages at nodes 74 and 76 approximately equal; the drive voltages required to effect the correction are stored on capacitors C2 and C3.

S7 and S8 are opened, and then S2 and S4 are opened and S1 is closed, thereby coupling input node 30 to C1 such that the voltage at differential pair input 32 is level-shifted to $\sim(V_{cm}+V_{ref})$. Switches S5 and S6 are also closed, such that the voltage at junction 60 is fed back to input 42 of differential pair 34. During this period, the current at front-end output node 62 varies with $V_{cm}$ (assuming node 62 drives a resistive or capacitive load), and the voltages stored on capacitors C2 and C3 enable differential pair 70 to provide the desired error correction currents.

Use of the auto-zero circuit in this way serves to calibrate out the front-end's offset voltage, as well as the charge injection offset voltage that arises when S3 is opened. Similarly, the same auto-zero cycle calibrates out the front-end's 1/f noise, as well as the kT/C noise produced by C1 (assuming a sufficiently fast sample rate).

The present invention requires the use of some means of correcting for the noise and offset that arises due to the level-shift. An auto-zero circuit such as that described above is preferred, though other error correction methods, such as a chopping scheme, for example, might also be employed.

Note that an actual instrumentation amplifier would employ two front-end circuits as described herein. The same reference voltage $V_{ref}$ would be provided to both front-end circuits, so that its effect is common-mode and thereby rejected.

Figure 5:
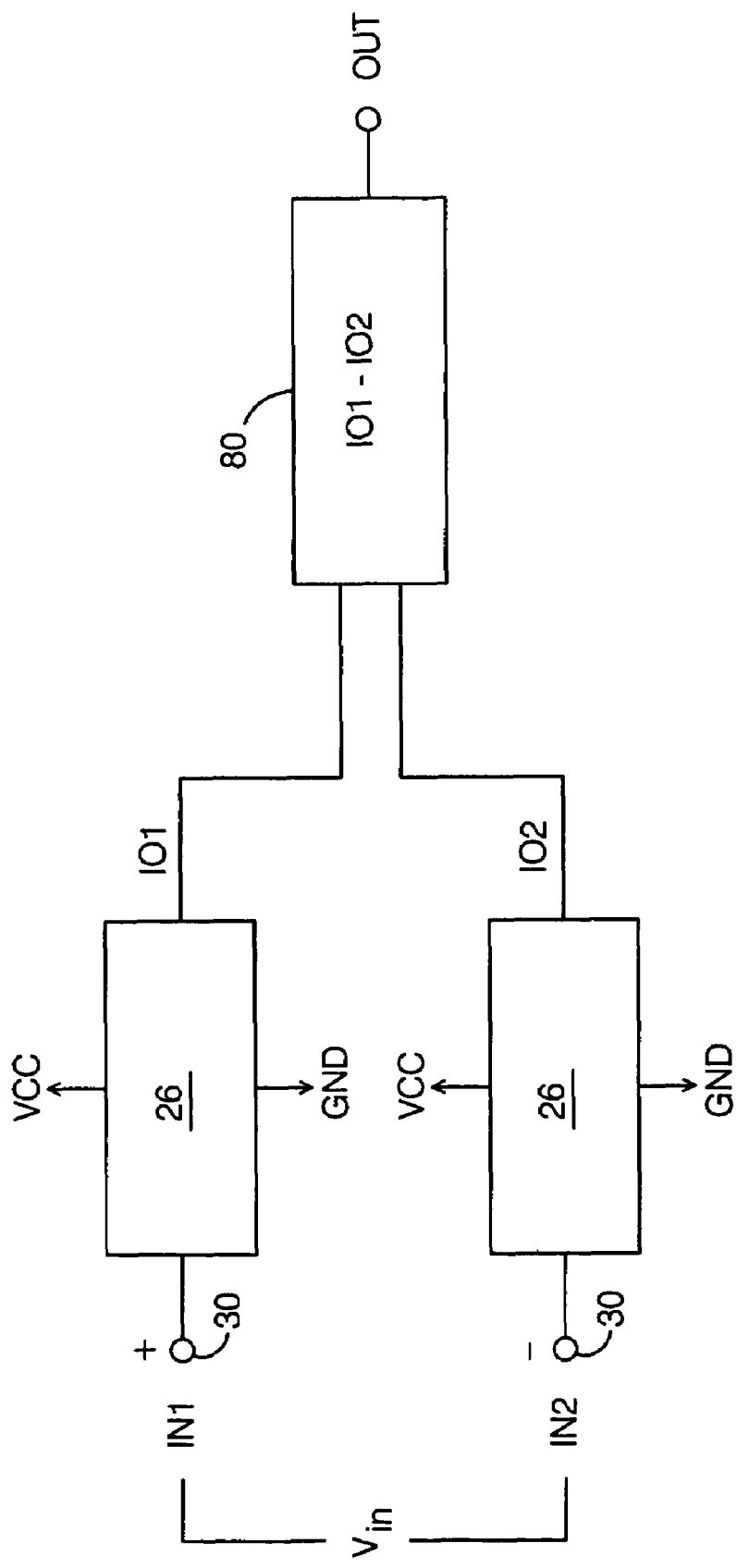
FIG. 5 is a block diagram of an instrumentation amplifier which includes first and second front-end circuits per the present invention.

A complete instrumentation amplifier is formed when a front-end circuit as described herein is combined with an output stage capable of receiving the signal current at front-end output node 62 and producing an output signal in response. One suitable application for the present front-end circuit is a current-mode instrumentation amplifier. As shown in FIG. 5, one way in which such an amplifier can be formed is with two front-end circuits 26, with the input node 30 of one serving as the instrumentation amplifier's positive input (IN1) and the input node of the other serving as the amplifier's negative input (IN2), with IN1 and IN2 receiving a differential input voltage $V_{in}$. The two front-end circuits produce respective output cur4rents, identified in FIG. 5 as IO1 and IO2.

The instrumentation amplifier is completed by combining the front-end circuits with a back-end circuit 80 which produces an output OUT which varies with the difference between IO1 and IO2. Preferably, each of the front-end circuits shares the same $V_{ref}$ level-shifting point, so that the differential input voltage to the overall instrumentation amplifier will remain zero after the auto-zero process described above is completed. The noise from $V_{ref}$ will be common mode to the overall instrumentation amplifier.

Note that the front-end circuit is not limited to use as part of a current-mode instrumentation amplifier. The circuit is useful for operational amplifiers generally, whenever there is a need to level-shift the input signal applied to a front-end without degrading the front-end's output signal due to offset and noise that might otherwise arise due to the level-shift.

Also note that the present front-end circuit is not limited to the implementations shown in FIGS. 2 and 3. There are numerous ways in which the circuit could be implemented; it is only essential that a level-shift be realized by charging a capacitance and then connecting it in series with an applied input signal, and that an error correction circuit be employed to reduce charge injection error and kT/C noise components that would otherwise be present in the front-end's output due to the level shift.

The embodiments of the invention described herein are exemplary and numerous modifications, variations and rearrangements can be readily envisioned to achieve substantially equivalent results, all of which are intended to be embraced within the spirit and scope of the invention as defined in the appended claims.

I claim:

1. An amplifier front-end circuit, comprising:
   an input node for receiving a common-mode voltage $V_{cm}$;
   a first differential transistor pair having first and second inputs and first and second outputs;
   a capacitor;
   a voltage source which provides a reference voltage $V_{ref}$;
   a switching network arranged to:
      charge said capacitor to $V_{ref}$;
      couple said capacitor to said first differential pair's first input and couple $V_{ref}$ to said first differential pair's second input such that the voltages at both inputs are $\sim V_{ref}$; and
      couple said input node to said capacitor such that the voltage at said first differential pair's first input is level-shifted to $\sim(V_{cm}+V_{ref})$; and
   an error correction circuit coupled to said first differential pair's first and second outputs and arranged to reduce charge injection error and kT/C noise components that would otherwise be present in said outputs due to said level shift.

2. The front-end circuit of claim 1, further comprising circuitry which receives said first differential pair's first and second outputs and provides a single-ended output current in response.

3. The front-end circuit of claim 2, wherein said circuitry comprises:
   a transistor, the current circuit of which conducts said single-ended output current; and
   a current source connected in series with said current circuit at a second node.

4. The front-end circuit of claim 3, wherein said switching network is further arranged to uncouple said first differential pair's second input from said reference voltage and couple it to said second node when said input node is coupled to said capacitor.

5. The front-end circuit of claim 3, wherein said current source comprises a field-effect transistor (FET), the drain of which is connected to said current circuit, said front-end circuit arranged such that the voltage at the drain of said FET is such that said FET operates in its saturation region when the voltage at said first input is $\sim(V_{cm}+V_{ref})$ and $V_{cm}=0$.

6. The front-end circuit of claim 1, further comprising:
   a load stage connected to receive said first differential pair's first and second outputs and arranged to provide an output which varies with the difference between said first differential pair's first and second outputs; and said error correction circuit comprises an auto-zero circuit coupled to said load stage such that it receives voltages at respective inputs which vary with said first differential pair's first and second outputs when the voltage at said first and second inputs is $\sim V_{ref}$, said auto-zero circuit arranged to provide currents to said first differential pair's first and second outputs needed to make the voltages at said auto-zero circuit's inputs approximately equal.

7. The front-end circuit of claim 6, wherein said load stage is a folded cascode stage which comprises:
   a pair of p-type transistors connected between a first supply voltage and third and fourth nodes and biased with a common bias voltage;
   a pair of n-type transistors connected between said third and fourth nodes and fifth and sixth nodes, respectively, the control inputs of said pair of n-type transistors connected together; and
   a second pair of n-type transistors connected between said fifth and sixth nodes and said circuit common point and biased with a common bias voltage;
   said first differential pair's first and second outputs coupled to said fifth and sixth nodes, and said auto-zero circuit coupled to said third and fourth nodes to receive said voltages which vary with said first differential pair's first and second outputs.

8. The front-end circuit of claim 7, wherein said auto-zero circuit comprises:
   a second differential transistor pair having first and second inputs and first and second outputs, the first and second outputs of said second differential pair coupled to said first differential pair's first and second outputs, respectively;
   second and third capacitors connected to the first and second inputs, respectively, of said second differential pair; and
   a current source connected to bias said second differential transistor pair;
   said auto-zero circuit and switching network arranged to, when the voltage at said first and second inputs is $\sim V_{ref}$, couple the first and second inputs of said second differential pair to said third and fourth nodes, thereby forming a negative feedback loop such that said auto-zero circuit provides said currents to said first differential pair's first and second outputs needed to make said detected voltages approximately equal.

9. An amplifier front-end circuit, comprising:
   an input node for receiving a common-mode voltage $V_{cm}$;
   a first differential transistor pair having first and second inputs and first and second outputs;
   a capacitor;
   a voltage source which provides a reference voltage $V_{ref}$ at an output;
   a folded cascode stage which receives said first differential pair's first and second outputs and provides a single-ended output in response;
   a second gain stage which receives said single-ended output and provides a single-ended output current, said second gain stage comprising:
      a transistor, the current circuit of which conducts said single-ended output current; and
      a field-effect transistor (FET), the drain of which is connected to said current circuit at a second node;
   a switching network arranged to:
      couple the first and second terminals of said capacitor to said reference voltage and a circuit common point, respectively, such that said capacitor is charged to $V_{ref}$;
      uncouple said first terminal of said capacitor from said reference voltage;
      couple said first terminal of said capacitor to said first differential pair's first input and couple said reference voltage to said first differential pair's second input such that the voltage at said first and second inputs is $\sim V_{ref}$; and couple said input node to the second terminal of said capacitor such that the voltage at said first input is $\sim(V_{cm}+V_{ref})$ and uncouple said first differential pair's second input from said reference voltage and couple it to said second node;

said front-end circuit arranged such that the voltage at the drain of said FET is such that said FET operates in its saturation region when the voltage at said first input is level-shifted to $\sim(V_{cm}+V_{ref})$ and $V_{cm}=0$; and an auto-zero circuit coupled to said folded cascode stage such that it receives voltages at respective inputs which vary with said first differential pair's first and second outputs, said auto-zero circuit arranged to provide currents to said first differential pair's first and second outputs needed to make the voltages at said auto-zero circuit's inputs approximately equal when the voltage at said first and second inputs is $\sim V_{ref}$, thereby reducing the charge injection error and kT/C noise components that would otherwise be present in said outputs due to said level shift.

10. An instrumentation amplifier, comprising:

first and second front-end circuits having respective input nodes which receive a differential input signal, each of said front-end circuits comprising:
  a first differential transistor pair having first and second inputs and first and second outputs;
  a capacitor;
  a voltage source which provides a reference voltage $V_{ref}$;
  a folded cascode stage which receives said first differential pair's first and second outputs and provides a single-ended output in response;
  a second gain stage which receives said single-ended output and provides a single-ended output current, comprising:
    a transistor, the current circuit of which conducts said single-ended output current; and
    a field-effect transistor (FET), the drain of which is connected to said current circuit at a second node;
  a switching network arranged to:
    charge said capacitor to $V_{ref}$;
    couple said capacitor to said first differential pair's first input and couple $V_{ref}$ to said first differential pair's second input such that the voltage at both inputs is $\sim V_{ref}$; and
    couple said input node to said capacitor such that the voltage at said first differential pair's first input is level-shifted to $\sim(V_{cm}+V_{ref})$ and uncouple said first differential pair's second input from said reference voltage and couple it to said second node;

said front-end circuit arranged such that the voltage at the drain of said FET is such that said FET operates in its saturation region when the voltage at said first input is level-shifted to $\sim(V_{cm}+V_{ref})$ and $V_{cm}=0$; and an error correction circuit coupled to said first differential pair's first and second outputs and arranged to reduce charge injection error and kT/C noise components that would otherwise be present in said outputs due to said level shift; and a back-end circuit arranged to provide an output which varies with the difference between the single-ended output current of said first front-end circuit and the single-ended output current of said second front-end circuit, thereby forming a current mode instrumentation amplifier.

11. The instrumentation amplifier of claim 10, wherein said error correction circuit is an auto-zero circuit coupled to said folded cascode stage such that it receives voltages at respective inputs which vary with said first differential pair's first and second outputs, said auto-zero circuit arranged to provide currents to said first differential pair's first and second outputs needed to make the voltages at said auto-zero circuit's inputs approximately equal when the voltage at said first and second inputs is $\sim V_{ref}$.

12. A method of level-shifting the common mode input signal provided to the front-end of an amplifier, comprising:
  applying a common-mode voltage $V_{cm}$ to an input node;
  providing a first differential transistor pair having first and second inputs and first and second outputs;
  charging a capacitor to a reference voltage $V_{ref}$;
  coupling said capacitor to said first differential pair's first input and coupling said reference voltage to said first differential pair's second input such that the voltage at said first and second inputs is $\sim V_{ref}$;
  providing a load stage connected to receive said first differential pair's first and second outputs and arranged to provide an output which varies with the difference between said first differential pair's first and second outputs;
  detecting voltages which vary with said first differential pair's first and second outputs when the voltage at said first and second inputs is $\sim V_{ref}$;
  providing currents to said first differential pair's first and second outputs needed to make said detected voltages approximately equal; and
  coupling said input node to said capacitor such that the voltage at said first input is level-shifted to $\sim(V_{cm}+V_{ref})$.

* * * * *